United States Patent [19]
Shoda et al.

[11] Patent Number: 6,150,072
[45] Date of Patent: *Nov. 21, 2000

[54] METHOD OF MANUFACTURING A SHALLOW TRENCH ISOLATION STRUCTURE FOR A SEMICONDUCTOR DEVICE

[75] Inventors: Naohiro Shoda, Manassas, Va.; Peter Weigand, Unterhaching, Germany

[73] Assignees: Siemens Microelectronics, Inc., Cupertino, Calif.; Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/916,636

[22] Filed: Aug. 22, 1997

[51] Int. Cl.⁷ .................................................. G03F 7/00
[52] U.S. Cl. ........................ 430/313; 430/316; 430/394; 216/17; 216/39; 438/424
[58] Field of Search ................................. 430/313, 314, 430/316, 312, 394; 438/424; 216/17, 19, 39

[56] References Cited

U.S. PATENT DOCUMENTS

| | | | |
|---|---|---|---|
| 3,753,807 | 8/1973 | Hoare et al. | 148/188 |
| 3,997,367 | 12/1976 | Yau | 148/1.5 |
| 4,307,179 | 12/1981 | Chang et al. | 430/314 |
| 4,407,060 | 10/1983 | Sakurai | 29/576 E |
| 4,484,979 | 11/1984 | Stocker | 156/646 |
| 4,546,534 | 10/1985 | Nicholas | 438/298 |
| 4,564,583 | 1/1986 | Maeguchi | 430/312 |
| 4,567,132 | 1/1986 | Fredericks et al. | 430/312 |
| 4,675,981 | 6/1987 | Naruke | 29/576 B |
| 4,758,530 | 7/1988 | Schubert | 437/69 |
| 5,089,442 | 2/1992 | Olmer | 432/235 |
| 5,121,237 | 6/1992 | Ikeda et al. | 359/67 |
| 5,123,743 | 6/1992 | Feldman | 356/394 |
| 5,262,346 | 11/1993 | Bindal et al. | 437/62 |
| 5,362,669 | 11/1994 | Boyd et al. | 438/437 |
| 5,366,929 | 11/1994 | Cleeves et al. | 438/644 |
| 5,371,047 | 12/1994 | Greco et al. | 437/238 |
| 5,382,532 | 1/1995 | Kobayashi et al. | 437/34 |
| 5,409,743 | 4/1995 | Bouffard et al. | 427/579 |
| 5,409,789 | 4/1995 | Ito | 430/5 |
| 5,419,991 | 5/1995 | Segawa | 430/20 |
| 5,434,093 | 7/1995 | Chau et al. | 437/41 |
| 5,453,639 | 9/1995 | Cronin et al. | 257/510 |
| 5,504,033 | 4/1996 | Bajor et al. | 437/67 |
| 5,516,721 | 5/1996 | Galli et al. | 437/67 |
| 5,518,950 | 5/1996 | Ibok et al. | 437/67 |
| 5,616,513 | 4/1997 | Shepard | 438/402 |
| 5,670,828 | 9/1997 | Cheung et al. | 257/773 |
| 5,691,215 | 11/1997 | Dai et al. | 438/305 |
| 5,804,490 | 9/1998 | Fiegl et al. | 438/424 |

*Primary Examiner*—Kathleen Duda
*Attorney, Agent, or Firm*—Banner & Witcoff, Ltd.

[57] ABSTRACT

A method for fabricating a shallow trench isolation structure involves several steps. The steps of an illustrative method include forming a first resist pattern on a substrate, etching the substrate to form a shallow trench therein using the first resist pattern as a mask, removing the first resist pattern from the substrate, depositing an oxide layer on the substrate including in the shallow trench, depositing a polish stop layer on the oxide layer, forming a second resist pattern on a portion of the polish stop layer substantially covering the shallow trench using the same mask as the mask for the first resist pattern, etching the polish stop layer, removing the second resist pattern leaving the portion of the polish stop layer substantially covering the shallow trench, polishing the oxide layer using the portion of the polish stop layer substantially covering the shallow trench as a polish stop, and removing the portion of the polish stop layer substantially covering the shallow trench.

12 Claims, 4 Drawing Sheets

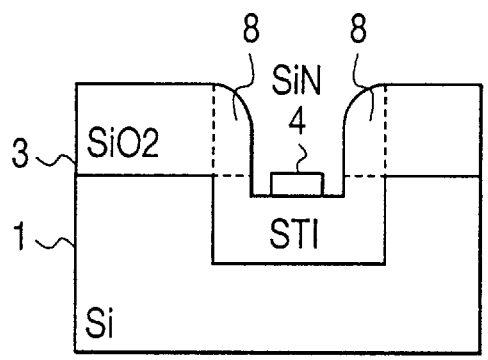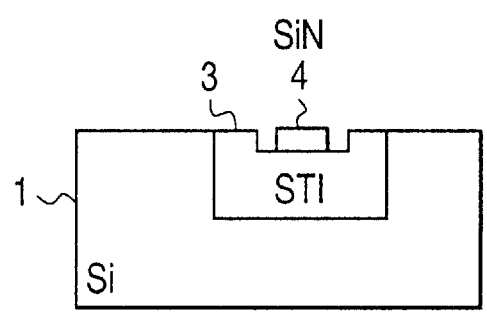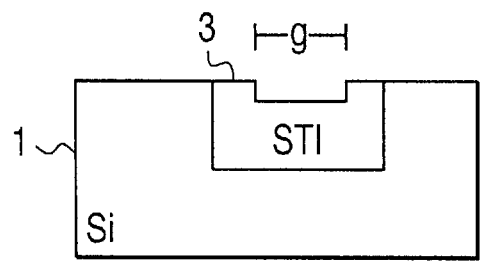

METHOD OF MANUFACTURING A SHALLOW TRENCH ISOLATION STRUCTURE FOR A SEMICONDUCTOR DEVICE

FIELD OF INVENTION

The invention generally relates to a semiconductor device and, more particularly, to a method of manufacturing a shallow trench isolation structure.

BACKGROUND OF INVENTION

In early MOS processing, a thick field oxide was grown over the entire surface of a semiconductor wafer. Areas were then opened in this thick layer for the transistor formation. This process had the problem of steep steps on the oxide which resulted in the breaking of metal lines deposited over these steps (step coverage). Modern MOS process techniques usually use the local oxidation of silicon process (LOCOS) which involves selective field oxidation of areas on the surface of a silicon substrate which will not be used for active devices. Selective oxidation has the advantage of resulting in a slope in the oxide step on the wafer surface, called a bird's beak, so that breaks are less likely to occur in the layers of interconnect material which run over these steps.

A bird's beak oxide slope occurs because thermal silicon dioxide grows fairly uniformly in all directions so lateral growth of oxide occurs under a polish stop layer such as silicon nitride ($Si_3N_4$) in the form of a bird's beak. The bird's beak causes several undesirable effects. For example, in modern small geometry scaled processes, the bird's beak occupies needed area and can cause current leakage.

To avoid the problems associated with bird's beaks and field oxide films, isolation of individual devices can be done by etching shallow vertical 'trenches' in the silicon between neighboring devices. Shallow trenches are principally used to control electron movement at a semiconductor surface, for example in MOSFET devices. Trench isolation allows devices to be moved much closer together and minimizes the problem of effective channel width control by eliminating the need for a field implant. Also, a more planar surface can be achieved by avoiding the formation of the bird's beak. A planar surface is beneficial for lithographic exposures since better resolution can be obtained without requiring additional depth of field to maintain a focussed image.

Conventional shallow trench isolation (STI) fabrication involves a series of steps including, silicon (Si) etching, oxide deposition and chemical mechanical polishing (CMP). To avoid erosion of oxide during CMP, a stopping layer is patterned on the oxide deposited in the shallow trench. A mask for patterning the stopping layer is needed which differs from the mask for Si etching.

FIGS. 1 (a)–1 (g) show a conventional method for fabricating an STI structure. On a silicon substrate layer 1, a resist pattern 2 for STI using a first mask is formed as shown in FIG. 1(a). Next, substrate 1 is etched (e.g., using reactive ion etching (RIE)) using resist pattern 2 as a mask to form a trench in the substrate 1 and the resist pattern 2 is removed. Then, a $SiO_2$ layer 3 is deposited on the substrate 1 leaving the structure shown in FIG. 1(b). The $SiO_2$ deposition can be performed by using thermal CVD (chemical vapor deposition) or plasma enhanced CVD (PECVD). These deposition methods result in the formation of areas 8 of $SiO_2$ over the STI region enclosed by the dashed lines in FIG. 1(b). Thereafter, a silicon nitride ($Si_3N_4$) (hereinafter referred to as SiN) layer 4 is deposited on the $SiO_2$ layer 3 by CVD or PECVD resulting in the structure shown in FIG. 1(c). A resist pattern 5 is then formed using a second mask different from the first mask on a portion of the SiN layer 4 as shown in FIG. 1(d). The remaining portion of the SiN layer 4 is etched using resist pattern 5 as a mask and the resist pattern 5 is removed, leaving the structure shown in FIG. 1(e). The $SiO_2$ layer 3 is polished using the SiN layer 4 as a polish stop layer resulting in the structure shown in FIG. 1(f). Next, the SiN layer 4 is removed using a well-known method such as RIE, chemical dry etching (CDE), or wet etching, leaving the shallow trench isolation structure of FIG. 1(g).

One of the problems which occurs with conventional methods of fabricating an STI structure such as the aforedescribed method is oxide erosion during CMP. The stopping layer is patterned on the oxide in the shallow trench as shown in FIGS. 1(d) and 1(e). Due to the areas 8 of $SiO_2$, portions of the STI structure are not protected by the polish stop (SiN) layer 4. Consequently, during CMP, oxide erosion occurs at the unprotected portions of the STI structure which can produce a non-planar surface over the STI structure.

Moreover, the resist pattern 5 requires a mask different from the mask for forming the resist pattern 2 which is used for Si etching (FIG. 1(a)) because $SiO_2$ deposition results in areas 8 of $SiO_2$ covering portions of the width of the STI structure such that the gap g between the $SiO_2$ sidewalls in the shallow trench is substantially less than the total width of the STI structure.

The oxide erosion tends to create high stress regions in adjacent device areas which car eventually result in the spontaneous formation of dislocations in the crystal lattice of the semiconductor substrate. Charge leakage from the devices formed in device areas of integrated circuits having STI structures has been associated with such dislocations.

SUMMARY OF THE INVENTION

The present invention overcomes the problems associated with prior art methods of fabricating an STI structure by providing a method of fabricating STI structures.

According to the present invention, plasma enhanced chemical vapor deposition (PECVD) using a high density plasma source (HDP-CVD) is used for oxide deposition. With HDP-CVD, a tapered slope at a top portion of the STI structure where the STI structure meets the substrate can be realized. According to other embodiments of the present invention, thermal CVD or PECVD can be used to realize the tapered slope structure. The distance between the corner of the STI structure, that is where the top of the STI structure meets the substrate and the slope is small and constant, and independent of the width of the STI structure and the space between STI structures. After HDP-CVD oxide deposition, the stopping layer for CMP is deposited on the oxide. Next, the same mask with a different type of resist as used for Si etching is used to form an inverse resist pattern. The width of the resist can be optimized by changing the dose of exposure. Thus, oxide erosion can be minimized because the polish stop layer can substantially protect the oxide in the STI structure.

An illustrative method for manufacturing a shallow trench isolation for a semiconductor device according to the present invention includes the step of forming a first resist pattern on a substrate, etching the substrate to form a shallow trench therein using the first resist pattern as a mask, removing the first resist pattern from the substrate, depositing an oxide layer on the substrate including in the shallow trench, the oxide layer having a tapered slope sloping away from a center portion of the shallow trench, depositing a polish stop layer on the oxide layer, forming a second resist pattern on a portion of the polish stop layer substantially covering the shallow trench using the same mask as the mask for the first resist pattern, etching the polish stop layer, removing the second resist pattern leaving the portion of the polish stop layer substantially covering the shallow trench, polishing of the oxide layer using the portion of the polish stop layer substantially covering the shallow trench as a polish stop, and removing the portion of the polish stop layer substantially covering the shallow trench.

BRIEF DESCRIPTION OF THE DRAWINGS

The present invention will now be described in more detail with reference to preferred embodiments of the invention, given only by way of example, and illustrated in the accompanying drawings in which:

FIGS. 1(a)–1(g) show a conventional method for fabricating an STI structure.

DETAILED DESCRIPTION

Figure 1A:
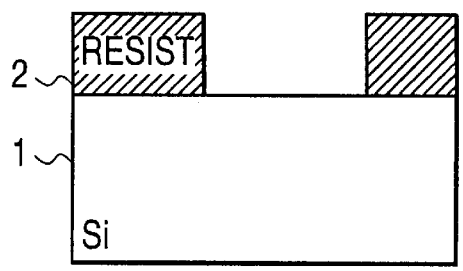
Figure 1B:
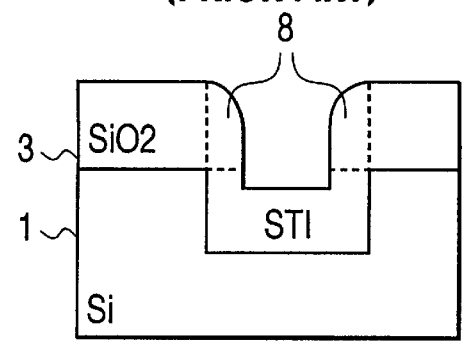
Figure 1C:
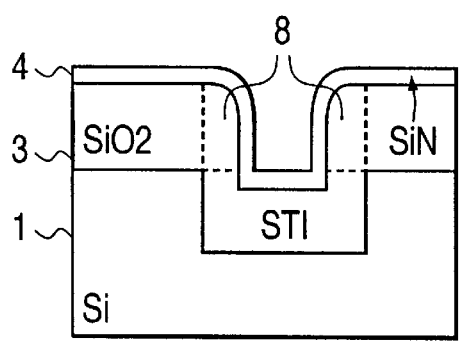
Figure 1D:
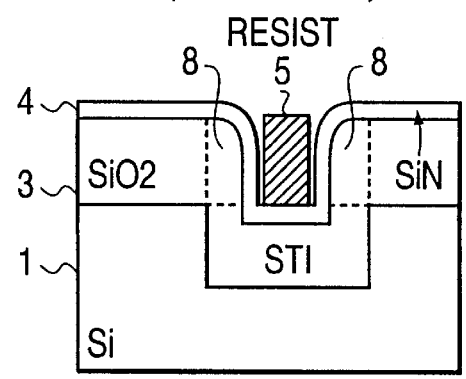
Figure 2A:
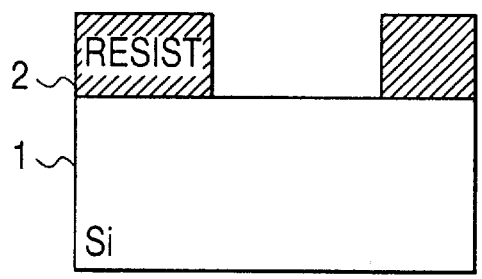
FIGS. 2(a)–2(g) show an exemplary method for fabricating an STI structure according to the present invention.
Figure 2B:
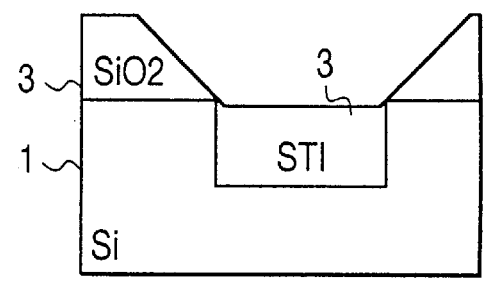

The present invention is discussed below with reference to fabricating an STI structure for semiconductor devices. However, it is to be understood that the method of present invention can be used to the extent applicable in other semiconductor fabrication processing such as interlayer dielectrics. In addition, the method may be adapted for use in the process for manufacturing memory devices such as 256 Mbit or larger DRAMs with trench capacitors An illustrative method of fabricating an STI structure according to the present invention is described with reference to FIGS. 2(a)–2(g). On a silicon substrate layer 1, a positive photoresist pattern 2 for STI is formed as shown in FIG. 2(a). The silicon substrate 1 is etched, by RIE for example, and the photoresist is stripped from the silicon substrate 1 forming a trench (e.g., STI structure) in the substrate 1. Next, a $SiO_2$ layer 3 is deposited in the STI structure and on an upper surface of the silicon substrate 1 by a known deposition technique such as plasma enhanced chemical vapor deposition (PECVD) using a high density plasma source (HDP-CVD) resulting in the structure shown in FIG. 2(b).

The high density plasma (HDP) source can be, but is not limited to, a helicon-wave excited plasma (HWP) or an inductively coupled plasma (ICP). The deposited $SiO_2$ layer 3, as depicted, in FIG. 2(b) tends to have a slope extending away from sidewalls of the STI structure and not covering a substantial portion of the STI structure, and also tends to have an oxide thickness at the corner of the STI structure which is very thin. Alternatively, a thermal CVD or PECVD with a sputter etchback can be used to provide an oxide layer 3 with the structure depicted in FIG. 2(b).

Figure 2C:
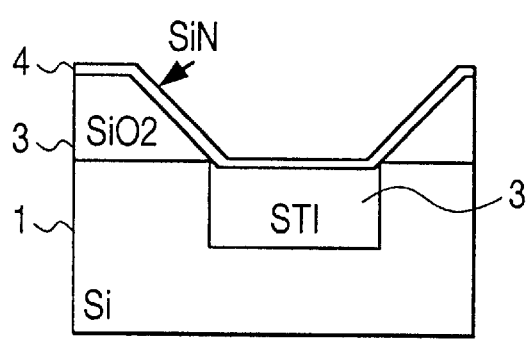
Figure 2D:
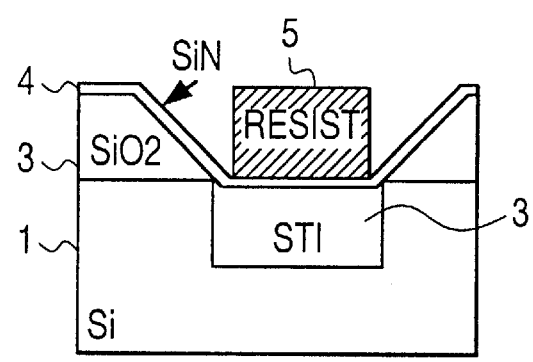

Next, a polish stop layer, such as SiN layer 4, is deposited by thermal CVD or PECVD on the $SiO_2$ layer 3 forming the structure shown in FIG. 2(c). The SiN layer 4 may have a thickness of 100–200 nm and serves as a polish stop layer for a subsequent CMP step. Thereafter, the same mask as used in FIG. 2(a) is used to form a resist pattern only on the STI structure as shown in FIG. 2(d). Typical positive or negative resist substances may be used. This is accomplished by using a photoresist which is of the opposite kind as the photoresist used in FIG. 2(a). Specifically, one photoresist is a positive resist and the other resist is a negative resist. In short, patterning of the silicon nitride layer 4 may be carried out by inverted resist patterning (negative to positive or positive to negative) using the same mask used to pattern the Si layer 1.

Figure 2E:
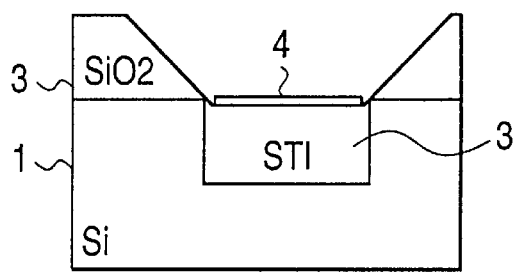
Figure 2F:
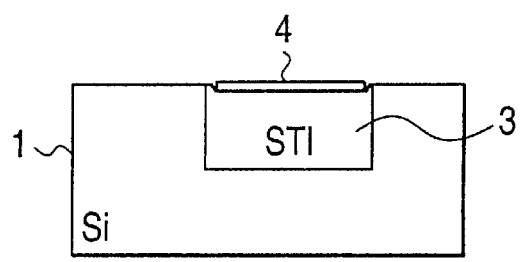
Figure 2G:
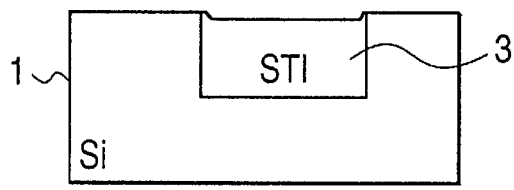

Then, the exposed portions of the SiN layer 4 are etched using the resist pattern 5 as a mask and the resist is removed leaving the structure depicted in FIG. 2(e). The structure of FIG. 2(e) is polished using CMP with the SiN layer 4 serving as a polish stop resulting in the structure of FIG. 2(f). Next, the SiN layer 4 is removed by, for example, a dry etch leaving the STI structure shown in FIG. 2(g).

An illustrative example of using the same mask according to the present inventor may occur as follows. A first resist pattern on the substrate 1 is formed by exposing a negative/positive resist to radiation through a mask. Exposed/unexposed portions of the resist are removed. Subsequently, the $SiO_2$ layer 3 and SiN layer 4 are formed as described above leaving the structure shown in FIG. 2(c). Thereafter, a positive/negative resist is provided on the surface of the SiN layer 4 and a second resist pattern is defined by exposing the positive/negative resist to radiation through the same mask. Thereafter, the unexposed/exposed portions are removed leaving the structure depicted FIG. 2(d).

In fabricating a plurality of STI structures, the present invention maintains the thickness of the oxide to be constant for all the STI structures. This results due to the polish stop layer (SiN) substantially covering each STI structure so that oxide erosion may be substantially reduced.

While particular embodiments of the present invention have been described and illustrated, it should be understood that the invention is not limited thereto since modifications may be made by persons skilled in the art. The present application contemplates any and all modifications that fall within the spirit and scope of the underlying invention disclosed and claimed herein.

What is claimed is:

1. A method for manufacturing a shallow trench isolation structure for a semiconductor device, said method comprising the steps of:

forming a trench in a semiconductor substrate;

forming a first material directly deposited on said semiconductor substrate, said first material filling said trench and having an inclined surface extending outward from edges of said trench, a surface of said first material within said trench being flat, a lower portion of the inclined surface being in contact with the edges of said trench;

forming a second material directly deposited on an entire surface of said first material within said trench, said second material functioning as an etching stopper; and removing said first material outside said trench.

2. The manufacturing method according to claim 1, wherein said first material is formed by a plasma enhanced CVD (PECVD) method using a high density plasma.

3. The method for manufacturing a semiconductor device according to claim 2, wherein the high density plasma includes one of a helicon wave excited plasma (HWP) or an inductively coupled plasma (ICP).

4. The method for manufacturing a semiconductor device according to claim 1, wherein said first material is formed by a CVD method under a condition that sputtering and etching take place simultaneously.

5. The method for manufacturing a semiconductor device according to claim 1, wherein said first material is oxide silicon and said second material is silicon nitride.

6. The manufacturing method according to claim 1, wherein the step of forming a trench is performed using a first resist as a mask, the step of removing said first material outside said trench is performed using a second resist as a mask, and said first and second resists are formed using a same reticle, wherein when said first resist is a positive resist, said second resist is a negative resist, and when said first resist is a negative resist, said second resist is a positive resist.

7. A method for manufacturing a shallow trench isolation structure for a semiconductor device, said method comprising the steps of:

forming a first resist having a first pattern on a semiconductor substrate;

forming a trench in a semiconductor substrate by etching said semiconductor while using said first resist as a mask;

removing said first resist;

forming a first material directly deposited on said semiconductor substrate, said first material filling said trench and having an inclined surface extending outward from edges of said trench, a surface of said first material within said trench being flat, a lower portion of the inclined surface being in contact with the edges of said trench;

forming a second material directly deposited on said first material;

forming a second resist having an inverted pattern of the first resist pattern;

etching said second material while using said second resist as a mask to leave said second material to cover an entire surface of said first material within said trench, said second material functioning as an etching stopper; and removing said first material outside said trench.

8. The method for manufacturing a semiconductor device according to claim 7, wherein a same reticle is used to form said first resist and said second resist, wherein when said first resist is a positive resist, said second resist is a negative resist, and wherein when said first resist is a negative resist, said second resist is a positive resist.

9. The manufacturing method according to claim 7, wherein said first material is formed by a plasma enhanced CVD (PECVD) method using a high density plasma.

10. The method for manufacturing a semiconductor device according to claim 9, wherein the high density plasma includes a helicon wave excited plasma (HWP) or an inductively coupled plasma (ICP).

11. The method for manufacturing a semiconductor device according to claim 7, wherein said first material is formed by a CVD method under a condition that sputtering and etching take place simultaneously.

12. The method for manufacturing a semiconductor device according to claim 7, wherein said first material is oxide silicon and said second material is silicon nitride.

* * * * *